United States Patent [19]

Bohrer

[11] Patent Number: 5,004,986
[45] Date of Patent: Apr. 2, 1991

[54] OP-AMP WITH INTERNALLY GENERATED BIAS AND PRECISION VOLTAGE REFERENCE USING SAME

[75] Inventor: Mark W. Bohrer, Saratoga, Calif.

[73] Assignee: Advanced Micro Devices, Inc., Sunnyvale, Calif.

[21] Appl. No.: 415,896

[22] Filed: Oct. 2, 1989

[51] Int. Cl.⁵ .............................................. H03F 3/45
[52] U.S. Cl. .................................... 330/257; 323/313; 323/316
[58] Field of Search .............. 330/257; 307/296.6; 323/313–316

[56] References Cited

U.S. PATENT DOCUMENTS

| 3,551,836 | 12/1970 | Greeson, Jr. | 330/257 |
| 4,755,767 | 7/1988 | Yamatake | 330/257 |
| 4,797,577 | 1/1989 | Hing | 307/296.6 |

OTHER PUBLICATIONS

Gray and Meyer, *Analysis and Design of Analog Integrated Circuits*, 2nd ed., John Wiley & Sons (1984), pp. 237–238, 253–262, and 364.

A Brokaw, "A Simple Three-Terminal IC Bandgap Reference", IEEE Journal of Solid-State Circuits, vol. SC-9, No. 6, Dec. 1974, pp. 388–393.

Nakajima et al, "A High-Speed High-Precision Monolithic Folding Amplifier for PCM Systems", 1973 *IEEE International Solid-State Circuits Conference*, Feb. 14, 1973, pp. 20, 21, 184.

Primary Examiner—James B. Mullins
Attorney, Agent, or Firm—Fliesler, Dubb, Meyer & Lovejoy

[57] ABSTRACT

An improved operational amplifier generates an output signal which varies according to plural input signals. An input stage accepts the input signals and outputs an intermediate signal according to the input signals, and generates an internal control signal in place of an external control signal. A current source provides a current according to the internally provided control signal. A conversion stage generates an output signal as a function of the intermediate signal and the current. An output driver stage drives the output signal to a load and buffers the operational amplifier from the load. A precision voltage reference generator based upon the operational amplifier provides a stable voltage reference signal. The output driver provides an internal feedback signal to the input stage, in place of the external input signals, and a bandgap reference cell in the first state establishes a voltage for the output driver in place of an external bias signal.

24 Claims, 4 Drawing Sheets

OP-AMP WITH INTERNALLY GENERATED BIAS AND PRECISION VOLTAGE REFERENCE USING SAME

BACKGROUND OF THE INVENTION

1. Field of the Invention

The present invention relates to an improved apparatus for converting plural input signals into an output signal. More particularly, it relates to an operational amplifier having an internally generated bias for stabilizing a current source, and a precision voltage reference generator using said op-amp.

2. Description of the Related Art

Operational amplifiers, or op-amps, are used to amplify a difference between two input signals, in order to generate an output signal. Typically, an op-amp consists of an input stage which converts the input signals into an intermediate signal whose current varies as the voltage difference between the two inputs changes. The varying-current intermediate signal is then converted into a varying-voltage signal via a conversion stage. An output driver generates the output signal as a function of the converted signal.

The industry standard "741" op-amp is typical of the prior art. See, Gray and Meyer, *Analysis and Design of Analog Integrated Circuits*. 2d ed., John Wiley & Sons, 1984, at p. 364.

The input stage typically includes a differential pair of input transistors having bases connected to receive the two input signals. The input transistors, collectors are connected to respective legs of a current mirror. One of the input transistors also supplies an "intermediate" signal, as a current, reflecting the voltage difference between the input signals.

The current mirror includes a matched pair of transistors, whose base leads are tied together and to the emitter of a mirror buffer transistor. The collector current which is drawn by the mirror buffer transistor is wasted, as it just runs to the supply terminal.

A conversion stage converts the intermediate signal from a current to a voltage. In one typical embodiment, the conversion stage consists of a transistor having its base connected to receive the "intermediate" signal and its collector coupled to a constant current source, and to the base of a buffer transistor. The emitter of the buffer transistor is coupled to generate the converted signal in response to the intermediate signal and a current signal received from the current source. The current source is stabilized by an external bias signal or other special biasing circuit associated with the current source.

Op-amps are used in "band-gap" voltage reference generators such as that shown in A. Brokaw, "A Simple Three-Terminal IC Bandgap Reference", IEEE Journal of Solid-State Circuits, Vol. SC-9, No. 6, December 1974, at p. 388.

It is desirable to have a more efficient op-amp which minimizes current consumption and heat generation, and requires a minimum number of external bias signals. It is also desirable to have a voltage reference generator, which requires no external bias signals.

SUMMARY OF THE INVENTION

The present invention provides an improved op-amp, with an input stage for accepting plural input signals and outputting an intermediate signal, a current source for providing a current, a conversion stage for generating an output signal as a function of the intermediate signal and the current, and an output driver stage for driving the output signal to a load and buffering the op-amp from the load. The present op-amp internally provides a control signal to the current source, reducing the op-amp's requirements for externally provided bias signals.

According to one aspect of the invention, a current mirror in the input stage establishes a stable junction at which the emitter of a mirror buffer transistor is connected. Current through the collector of the mirror buffer transistor is therefore stable. This current through the mirror buffer is used as the internally generated control signal, and therefore is not wasted by simply being shunted to a supply terminal.

In another aspect of the invention, the op-amp is used as the basis for a precision voltage reference generator with no external bias signals. A bandgap reference cell in the input stage establishes a temperature compensated reference which drives the output stage.

Other aspects and advantages of the present invention can be seen upon review of the drawings, detailed description, and the claims which follow.

DETAILED DESCRIPTION OF THE PREFERRED EMBODIMENTS

Figure 1:
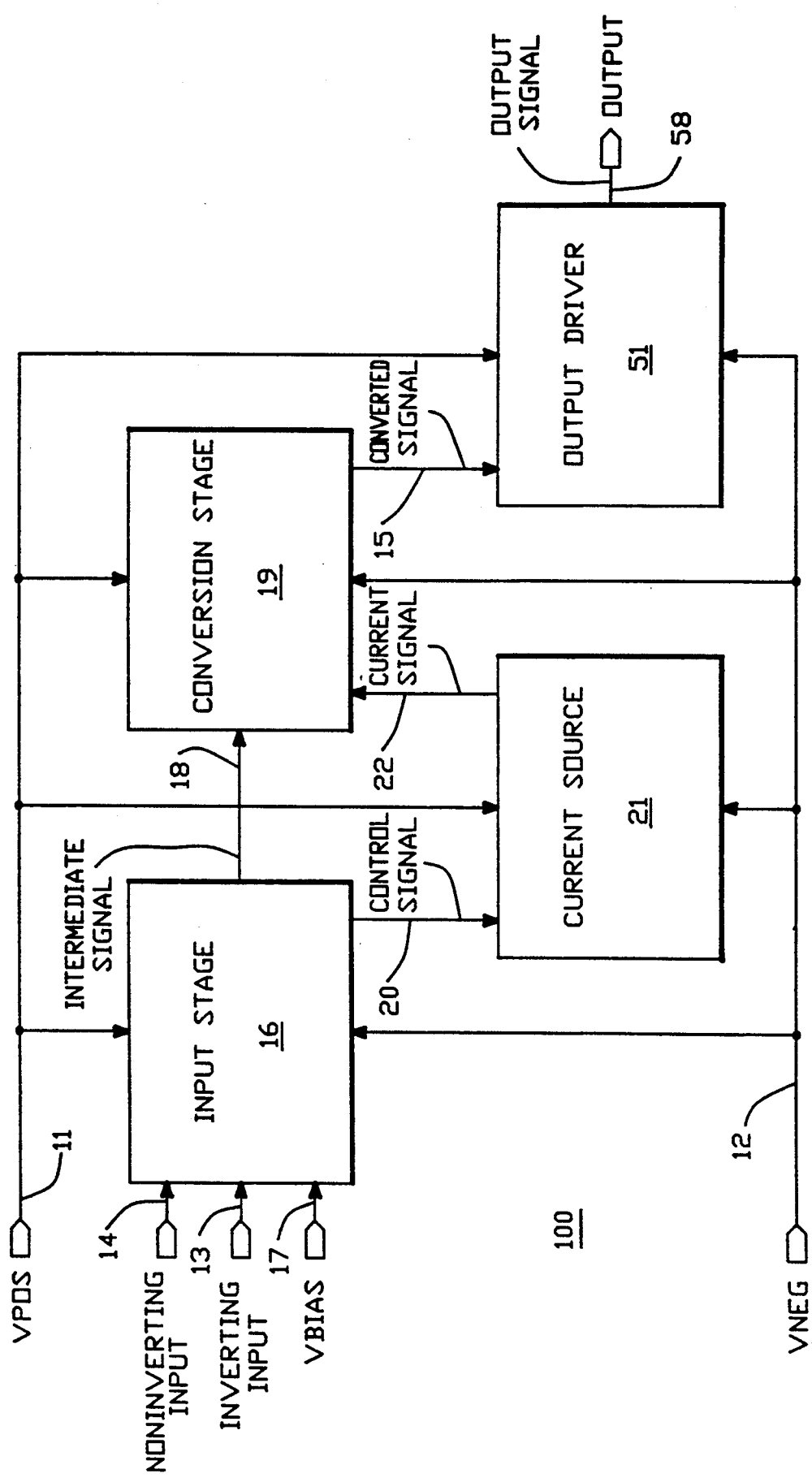
FIG. 1 depicts a simplified diagram of an op-amp embodiment of the present invention, showing signal passage between elements.

FIG. 1 is a simplified diagram of the op-amp 100 of the present invention. The op-amp 100 is powered by first and second power signals 11 and 12. The op-amp 100 accepts first and second input signals 13 and 14 from external signal sources INVERTING INPUT and NONINVERTING INPUT, and gives output signal 58 indicating the difference between the input signals 13 and 14. First and second input signals 13 and 14 arrive at input stage 16 of the op-amp 100, along with bias signal 17. Input stage 16 translates the differential input signals 13 and 14 into a single intermediate signal 18, and supplies the intermediate signal 18 to conversion stage 19. Also, input stage 16 supplies a stable bias control signal 20 to current source 21.

Current source 21 supplies a constant current 22 to conversion stage 19 in response to the control signal 20. Conversion stage 19 converts the intermediate signal 18 into converted signal 15, which is sent to output driver 51. Output driver 51 drives final output signal 58 in response to converted signal 15. By internally providing control signal 20 from a stable node in the input stage 16, the op-amp 100 eliminates the need for one additional external bias signal driving the current source 21.

Figure 2:
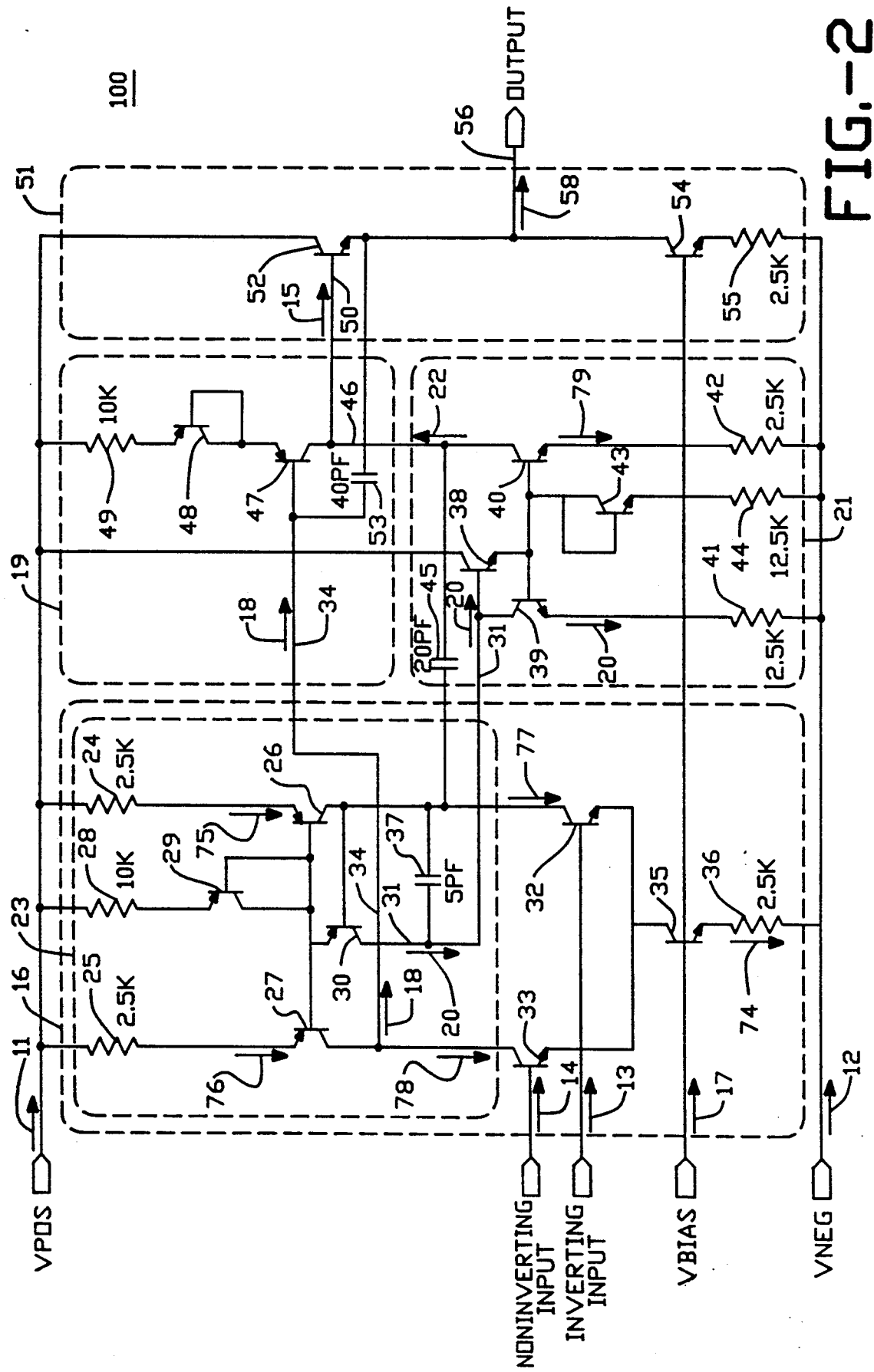
FIG. 2 is a circuit diagram of an op-amp according to the present invention.

FIG. 2 is a circuit schematic of an op-amp 100 according to the present invention. First power signal 11 arrives from external power source VPOS, and second power signal 12 arrives from external power source VNEG.

The input stage 16 includes a first current mirror 23 and a differential pair of input transistors 32 and 33. First current mirror 23 has first and second resistors 24 and 25 coupled to power source VPOS. Current mirror 23 has a first p-n-p transistor 26, whose emitter is coupled to first resistor 24, and a second p-n-p transistor 27 whose emitter is coupled to second resistor 25. The bases of first and second transistors 26 and 27 are coupled together. First current mirror 23 also has resistor 28 coupled to power source VPOS, and to the emitter of diode connected transistor 29. The collector and base of transistor 29 are coupled to the junction of the bases of transistors 26 and 27. Also coupled to that junction is the emitter of mirror buffer transistor 30. The base of mirror buffer transistor 30 is coupled to the collector of first transistor 26, and the collector of mirror buffer transistor 30 is coupled to control signal line 31. A capacitor 37 is coupled between the collectors of transistors 26 and 30.

The base of first input transistor 32 (n-p-n) is coupled to the external signal source INVERTING INPUT to receive first input signal 13. The base of second input transistor 33 (n-p-n) is coupled to external signal source NONINVERTING INPUT, to receive second input signal 14.

The collector of first input transistor 32 is coupled to the collector of first transistor 26 of the current mirror 23 and to the base of mirror buffer transistor 30. The collector of second input transistor 33 (n-p-n) is coupled to the collector of second transistor 27 of the current mirror 23. Coupled to the collectors of input transistor 33 and mirror transistor 27 is intermediate signal line 34.

The emitters of first and second input transistors 32 and 33 are coupled together, and to the collector of current source transistor 35. The base of transistor 35 is coupled to external signal source VBIAS, to receive external bias signal 17. The emitter of transistor 35 is coupled through resistor 36 to external power source VNEG.

The current source 21 comprises a current mirror circuit including (n-p-n) mirror transistors 39 and 40 and (n-p-n) buffer transistor 38. Control signal line 31 is coupled to the base of buffer transistor 38 of current source 21. The collector of buffer transistor 38 is coupled to external power source VPOS. The bases of mirror transistors 39 and 40 are coupled together and to the emitter of buffer transistor 38.

Diode connected transistor 43 is coupled between the junction of the bases of transistors 39 and 40, and resistor 44. The collector of transistor 39 is coupled to the control line 31, and the emitter of transistor 39 is coupled to resistor 41. The emitter of transistor 40 is coupled to resistor 42. Resistors 41, 42 and 44 are all coupled to external power source VNEG. The collector of transistor 40 is coupled through capacitor 45 back to the collectors of transistors 32 and 26 of the input stage 16.

The collector of transistor 40 mirrors the current 20 that flows in the control signal line 31 and through transistor 39, and supplies the constant current 79 to current signal line 46, which is connected to conversion stage 19.

Conversion stage 9 has (p-n-p) converter transistor 47 whose base is coupled to intermediate signal line 34, and whose collector is coupled to current signal line 46. The emitter of converter transistor 47 is coupled to both the collector and the base of transistor 48, and the emitter of transistor 48 is coupled to resistor 49. Resistor 49 is then coupled to external power source VPOS.

A signal line 50 is coupled to the collector of transistor 47, and to output driver 51. Output driver 51 consists of emitter follower transistor 52, whose base is coupled to signal line 50, and whose collector is coupled to external power source VPOS. The emitter of transistor 52 is coupled through capacitor 53 to the base of transistor 47 of the conversion stage 19. The emitter of transistor 52 is also coupled to the collector of current source transistor 54. The base of transistor 54 is coupled to the external bias source VBIAS. The emitter of transistor 54 is coupled to resistor 55 which is then coupled to external power source VNEG. Coupled to the emitter of emitter follower transistor 52 is output signal line 56, which is then coupled to the external terminal OUTPUT.

In operation, first and second input signals 13 and 14 arrive from the external signal sources INVERTING INPUT and NONINVERTING INPUT, to the bases of first and second input transistors 32 and 33, respectively. If first and second input signals 13 and 14 are equal, the current 74 flowing through input stage 16 will be equally divided along the first and second current paths. Each input transistor 32 and 33 will then be conducting half of the current 74 which flows through transistor 35. However, as input signals 13 and 14 vary with respect to each other, the first and second input transistors 32 and 33 will draw unequal amounts of current 77 and 78 along their respective current paths.

If first input signal 13 is stronger than second input signal 14, first input transistor 32 will draw a first draw current 77 greater than the second draw current 78 which will be drawn by second input transistor 33. However, the current mirror 23 forces equal currents 75 and 76 along the respective current paths. Because the collector of mirror transistor 26 is directly coupled to the collector of input transistor 32 with no direct alternate current path, first draw current 77 through input transistor 32 will be equivalent to current 75 through mirror transistor 26, less the base current of mirror buffer transistor 30. Therefore, any discrepancy between the currents in the input transistors 32 and 33 will show up on intermediate signal line 34 as intermediate signal 18.

Current mirror 23 establishes a stable voltage at the junction between the bases of transistors 26 and 27. Mirror buffer transistor 30, having its emitter coupled to that junction and therefore subject to that constant voltage, will supply a constant current 20 at its collector. In the present invention, that current 20 is also used as control signal 20, which is sent to current source 21.

Current source 21 consists essentially of another current mirror. That current mirror 21 has transistor 38, which is kept in a very steady state by the constant control signal 20 arriving at its base. The flows down the current path of transistor 39 and resistor 41 to external power source VNEG. Because transistors 39 and 40 are coupled at their bases and have equivalent emitter circuits, transistor 40 will always draw a current 79 at its collector, equivalent to the current 20 which is flowing into the collector of transistor 39 from control line 31. This current 79 constitutes current signal 22. The voltage of converted signal 15 on signal line 50 varies in response to the intermediate signal 18 about a center level set by the current signal 22.

Figure 3:
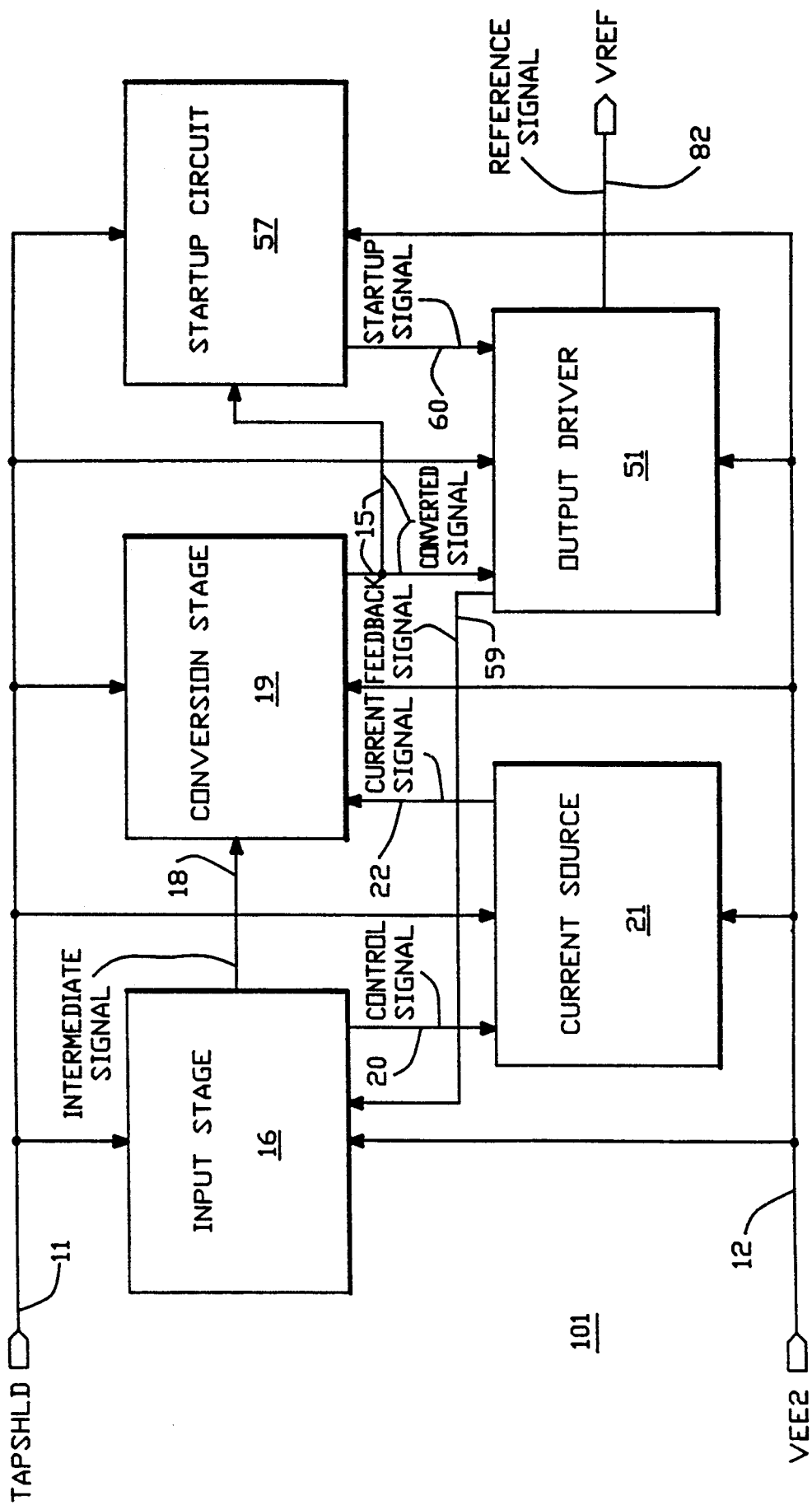
FIG. 3 depicts a simplified diagram of a precision voltage reference generator embodiment of the present invention, showing signal passage between elements.

FIG. 3 shows a precision voltage reference generator 101 based upon the op-amp of the present invention. The voltage reference 101 has input stage 16, conversion stage 19, current source 21, output driver 51, and startup circuit 57, which are all powered by first and second power signals 11 and 12. The input stage 16 generates a temperature-independent intermediate signal 18 and supplies it to conversion stage 19. Also, the input stage 16 generates a stable bias control signal 20 and supplies it to current source 21. The conversion stage 19 converts the intermediate signal 18 into a converted signal 15.

Current source 21 generates current signal 22 and supplies it to conversion stage 19. Conversion stage 19 sends converted signal 15 to output driver 51. Output driver 51 then generates voltage reference signal 82 on reference line 56 and provides feedback signal 59 to the input stage 16. Reference signal 82 is then available at reference node VREF. The voltage reference 101 does not rely on any input bias signals.

Figure 4:
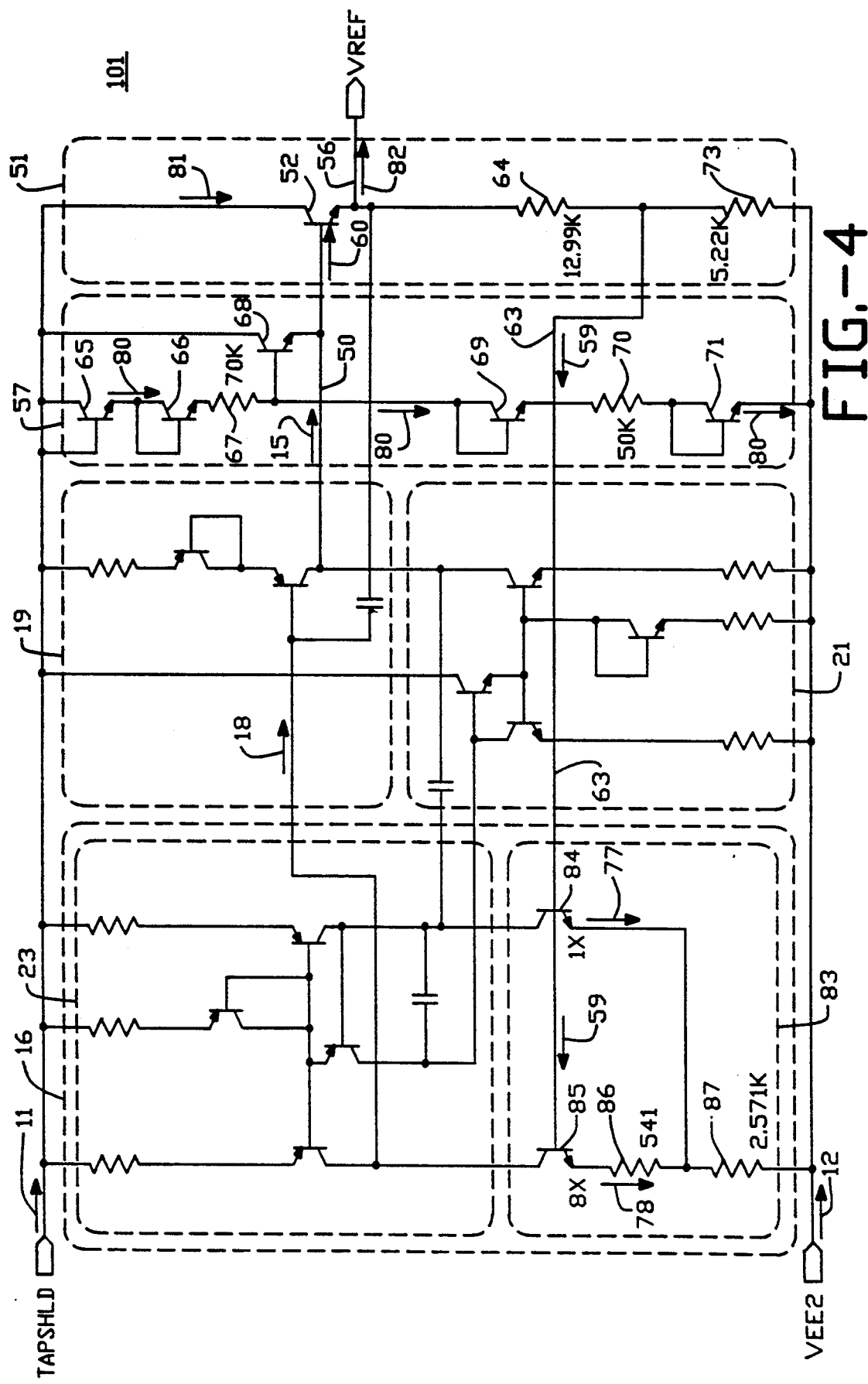
FIG. 4 is a circuit diagram of a voltage reference generator according to the present invention.

FIG. 4 is a circuit schematic of a precision voltage reference generator 101 based upon the present invention. The current source 21 and conversion stage 19 are the same as in FIG. 2. The input stage 16 is modified to be coupled to only two external power sources TAPSHLD and VEE2.

The first and second input transistors 32 and 33, the current source transistor 35, and resistor 36 of FIG. 2 are replaced with bandgap reference cell 83. Bandgap reference cell 83 has first and second bandgap transistors 84 and 85, with second bandgap transistor 85 having an emitter area eight times that of first bandgap transistor 84. The emitter of second bandgap transistor 85 is coupled to resistor 86. The emitter of first bandgap transistor 84 is coupled to the other side of resistor 86, and to resistor 87. Resistor 87 is then coupled to external VEE2. The bases of first and second bandgap transistors 84 and 85 are coupled together and to feedback signal line 63. Feedback signal line 63 is then coupled to output driver 51.

In output driver 51, current source transistor 54 and resistor 55 of FIG. 2 have been replaced with resistors 64 and 73. Resistor 64 is coupled between the emitter of transistor 52 and the feedback signal line 63. Resistor 73 is coupled to feedback signal line 63, and to external power source VEE2.

Voltage reference 101 further includes startup circuit 57, which is powered by external power sources TAPSHLD and VEE2. A transistor 65 has its base and collector coupled to external power source TAPSHLD, and its emitter coupled to the base and collector of transistor 66. The emitter of transistor 66 is coupled to resistor 67, which is then coupled to the base of transistor 68 and to the collector and base of transistor 69. The emitter of transistor 68 is connected to signal line 50 and to the base of the emitter follower transistor 52. The emitter of transistor 69 is connected to resistor 70, which is then connected to the collector and base of transistor 71. The emitter of transistor 71 is then coupled to external power source VEE2.

The voltage reference generator 101 has two stable states, first where no current flows through the circuit, and second where current flows and the reference signal 82 is generated. Upon startup, the startup circuit 57 sends startup signal 60 to the output driver 51, by pulling the base of emitter follower transistor 52 up. The rise at the base of emitter follower transistor 52 powers the output driver 51 to supply an initial signal across feedback line 63 to the input stage 16. This shifts the voltage reference generator 101 to the second, powered state. When in operation, the converted signal 15 will cause the base of emitter follower transistor 52 to rise above the base of transistor 68 to turn off transistor 68 and eliminate any further effect of the startup circuit 57 upon voltage reference 101.

In the precision voltage reference generator embodiment 101 of the present invention, the operation of the current source 21 and conversion stage 19 is identical to that described above. The operation of the current mirror 23 of the input stage 16 is likewise identical. The bandgap reference cell 83 establishes a feedback voltage at feedback signal line 63.

The present invention has been shown and described as being based on bipolar transistor technology. It will be understood by those skilled in the art that equivalent circuits may be built using CMOS transistor technology, or by substituting n-p-n transistors for p-n-p transistors and vice versa. While the present invention has been shown and described with reference to preferred embodiments thereof, it will be understood by those skilled in the art that these and various other changes in form and detail may be made therein without departing from the scope and spirit of the invention itself.

I claim:

1. An apparatus for converting a first input signal and a second input signal into an output signal said apparatus comprising:
    input stage means, receiving said input signals, for producing an intermediate signal in response to said input signals, and for generating a stable control signal which is substantially independent of fluctuations of said input signals, said input stage means including a first current mirror having,
    (i) a junction at which a stable reference signal is maintained,
    (ii) a first transistor having a control terminal coupled at said junction, and having first and second current terminals,
    (iii) a second transistor having a control terminal coupled at said junction, and having first and second current terminals, and
    (iv) mirror buffer means for generating said stable control signal in response to said stable reference signal said mirror buffer means having a control terminal coupled to said first current terminal of said first transistor, a first current terminal coupled to said junction, and a second current terminal for transmitting said stable control signal;
    current source means, coupled to said second current terminal of said mirror buffer means, for supplying a current signal in response to said stable control signal; and
    means, coupled to said current source means and said input stage means, for converting said intermediate signal into said output signal in response to said current signal and said intermediate signal.

2. The apparatus of claim 1 wherein said current source means comprises a second current mirror including:
    first transistor means, having a control terminal, current terminal coupled to said second current terminal of said mirror buffer means to receive said stable control signal, for generating a mirror current in response to said stable control signal; and
    second transistor means, having a control terminal coupled to said control terminal of said first transistor means and a current terminal coupled to said converter means, for generating said current signal in to said mirror current.

3. An apparatus for converting a first and a second input signal into an output signal, comprising:
- first transistor means, having a control terminal coupled at a junction, and having a current terminal, for generating a current;
- second transistor means, having a control terminal coupled at said junction to establish a reference, and having a current terminal for generating a current;
- mirror buffer means, having a control terminal coupled to said current terminal of said first transistor means, and having a first current terminal coupled to said junction, and having a second current terminal, for generating a control signal on said second current terminal in response to said reference;
- a differential pair of first and second input transistor means, each having a control terminal coupled to receive a respective one of said input signals, and a current terminal coupled to the current terminal of a respective one of said first and second transistor means, for generating an intermediate signal in response to said first and second input signals;
- current source means, coupled to receive said control signal, for generating a current signal in response to said control signal; and
- means, coupled to receive said current signal and said intermediate signal, for converting said intermediate signal into said output signal in response to said current signal and said intermediate signal.

4. The apparatus of claim 3 wherein said means for converting includes
- output driver means for driving said output signal from said means for converting.

5. An apparatus for generating a voltage reference signal, said apparatus comprising:
- means for generating feedback signal in response to said voltage reference signal;
- input stage means for producing an intermediate signal in response to said feedback signal said input stage means including,
  - (i) a junction which maintains a stable reference independently of fluctuations of said feedback signal,
  - (ii) a buffer transistor for generating a control signal in response to said stable reference;
- current source means, coupled to said buffer transistor, for supplying a current signal in response to said control signal, said current source including a current mirror having,
  - (i) first transistor means, having a control terminal, and having a current terminal coupled to receive said control signal, for generating a mirror current on its current terminal in response to said control signal, and
  - (ii) second transistor means, having a control terminal coupled to the control terminal of said first transistor means, and having a current terminal, for generating said current signal on its current terminal in response to said mirror current;
- converter means, coupled to said current terminal of said second transistor means of said current source means and to said input stage means, for converting said intermediate signal into a converted signal in response to said current signal and said intermediate signal; and
- output driver means, coupled to said converter means, for generating said voltage reference signal in response to said converted signal.

6. An apparatus for generating a voltage reference signal, comprising:
- means for generating a feedback signal;
- input stage means for producing an intermediate signal in response to said feedback signal, said input stage means including,
  - (i) a junction which maintains a stable reference independently of fluctuations of said feedback signal,
  - (ii) a first transistor, having a control terminal coupled at said junction, and having a current terminal,
  - (iii) a second transistor, having a control terminal coupled at said junction, and having a current terminal,
  - (iv) mirror buffer means for generating a control signal in response to said stable reference, said mirror buffer means having a control terminal coupled to said current terminal of said first transistor, a first current terminal coupled to said junction, and a second current terminal;
- current source means, coupled to said second current terminal of said mirror buffer means, for supplying a current signal in response to said control signal;
- converter means, coupled to said current source means and said input stage means, for converting said intermediate signal into a converted signal in response to said current signal and said intermediate signal; and
- output driver means, coupled to said converter means, for generating said voltage reference signal in response to said converted signal.

7. The apparatus of claim 6 wherein said junction and said first and second transistors are a current mirror, and said input stage means further comprises:
- means, coupled to said current mirror, for establishing a feedback voltage and for providing said feedback voltage to said output driver means.

8. The apparatus of claim 7 wherein said means for establishing a feedback voltage comprises:
- a bandgap reference cell.

9. The apparatus of claim 6 wherein said current source means comprises:
- a current mirror including,
  - (i) first transistor means, having a control terminal, and having a current terminal coupled to receive said control signal, for generating a mirror current in response to said control signal, and
  - (ii) second transistor means, having a control terminal coupled to the control terminal of said first transistor means, and having a current terminal coupled to said converter means, for generating said current signal on its current terminal in response to said mirror current.

10. An apparatus for generating a voltage reference signal, said apparatus comprising:
- first transistor means, having a control terminal coupled at a junction, and having a current terminal, for generating a first current;
- second transistor means, having a control terminal coupled at said junction, and having a current terminal for generating a second current substantially equal to said first current, wherein said junction maintains a reference level;
- third transistor means for generating a control signal in response to said reference level, said third transistor means having, (i) a control terminal coupled to said current terminal of said first transistor means,
(ii) a first current terminal coupled to said junction, and
(iii) a second current terminal;

bandgap reference cell means, coupled to said first and second transistor means, for generating an intermediate signal in response to a feedback signal and said first and second currents;

current source means, coupled to said third transistor means, for generating a current signal in response to said control signal;

converter means, coupled to said current source means and to said bandgap reference cell means, for converting said intermediate signal into a converted signal in response to said current signal and said intermediate signal; and output driver means, coupled to said converter means and said bandgap reference cell means, for establishing said voltage reference signal in response to said converted signal and for generating said feedback signal.

11. The apparatus of claim 10 wherein said apparatus has a stable, unpowered state and a stable, powered state, said apparatus further comprising:
startup circuit means, coupled to said output driver means, for generating a startup signal; and
said output driver means being responsive to said startup signal to shift said apparatus into said stable, powered state.

12. The apparatus of claim 11 wherein:
said startup circuit means is coupled to said converter means and is responsive to said converted signal to shut off and cease generating said startup signal.

13. A method of converting a first and a second input signal into an output signal, comprising the steps of:
accepting said first and second input signals;
generating an intermediate signal as a function of said first and second input signals;
establishing a stable reference whose stability is independent of fluctuations of said input signals;
generating a control signal according to said stable reference and independently of fluctuations of said input signals;
producing a current signal according to said control signal and independently of fluctuations of said input signals; and
converting said intermediate signal to said output signal according to said current signal.

14. The method of claim 13 wherein said step of generating said intermediate signal further comprises the steps of:
providing a first path current;
mirroring a second path current from said first path current;
drawing a first draw current as a function of said first input signal and said first path current;
drawing a second draw current as a function of said second input signal; and
dividing said second path current to supply said second draw current and to generate said intermediate signal.

15. The method of claim 14, wherein:
said steps of providing said first path current and mirroring said second path current are performed by operating a first and a second mirror transistor, each mirror transistor having a control terminal and a current terminal, said first and second path currents being conducted by said first and second mirror transistors, respectively;
said step of establishing said stable reference is performed by the control terminals of the first and second mirror transistors being coupled together; and
said step of generating said control signal is performed by operating a buffer transistor having a first current terminal coupled to the control terminals of said mirror transistors, a control terminal coupled to the current terminal of said first mirror transistor, and a second current terminal which conducts said control signal.

16. A method of generating a voltage reference signal, comprising the steps of:
generating an intermediate signal as a function of a feedback signal;
establishing a stable reference, whose stability is independent of said feedback signal and said intermediate signal;
internally generating a control signal according to said stable reference;
producing a current signal according to said control signal;
converting said intermediate signal to a converted signal, according to said current signal;
generating said voltage reference signal according to said converted signal; and
producing said feedback signal according to said voltage reference signal.

17. The method of claim 16 wherein said step of generating said intermediate signal further comprises the steps of:
providing a first path current;
mirroring a second path current from said first path current;
drawing a first draw current as a function of said feedback signal and said first path current;
drawing a second draw current as a function of said feedback signal; and
dividing said second path current to supply said second draw current and to generate said intermediate signal.

18. The method of claim 17, wherein:
said steps of providing said first path current and mirroring said second path current are performed by operating a first and a second mirror transistor, each mirror transistor having a control terminal and a current terminal, said first and second path currents being conducted by said first and second mirror transistors. respectively;
said step of establishing said stable reference is performed by the control terminals of the first and second mirror transistors being coupled together; and
said step of generating said control signal is performed by operating a buffer transistor having a first current terminal coupled to the control terminals of said mirror transistors, a control terminal coupled to the current terminal of said first mirror transistor, and a second current terminal which conducts said control signal.

19. The method of claim 16 further comprising the initial ordered steps of:
providing a startup signal to cause occurrence of said step of producing said feedback signal; and
responsive to said converting step, halting production of said startup signal.

20. An apparatus for generating an output signal as a function of a first and a second input signal, said apparatus comprising:
   input stage means for receiving said input signals, said input stage means including,
   (i) a junction for maintaining a stable reference voltage,
   (ii) means, coupled to said junction, for generating a stable control signal as a function of said stable reference voltage and independent of fluctuations in said input signals, and
   (iii) means for producing an intermediate signal as a function of said input signals;
   current source means for generating a current signal as a function of said control signal, said current source means including a current mirror having,
   (i) first transistor means, having a control terminal and having a current terminal coupled to said input stage means to receive said control signal, for generating a mirror current as a function of said control signal and
   (ii) second transistor means, having a control terminal coupled to the control terminal of said first transistor means, and having a current terminal, for generating said current signal as a function of said mirror current;
   converter means, coupled to said current source means and said input stage means, for converting said intermediate signal into a converted signal as a function of said current signal and said intermediate signal; and
   output driver means, coupled to said converter means, for generating said output signal as a function of said converted signal.

21. A circuit comprising:
   an input stage including,
   (i) a differential pair of transistors, each coupled to receive a respective input signal, each for producing a respective current according to its respective input signal,
   (ii) a current mirror coupled to receive said respective currents, for producing an intermediate signal according to a difference between said respective input signals, said current mirror including a junction at which said current mirror establishes a stable reference, and
   (iii) a buffer transistor having a current terminal coupled to said junction and having a control terminal coupled to said current mirror and to one of said differential pair of transistors, for producing a stable control signal according to said stable reference.

22. The circuit of claim 21 further comprising:
   a current source coupled to receive said stable control signal, for producing a current signal according to said stable control signal;
   a conversion stage coupled to receive said current signal and said intermediate signal, for converting said intermediate signal into a converted signal according to said current signal and said intermediate signal; and
   an output stage coupled to receive said converted signal, for generating an output signal according to said converted signal.

23. The circuit of claim 22, wherein:
   said input stage receives two external input signals; and
   said output signal is an amplified signal according to said two external input signals, such that said apparatus functions as an operational amplifier.

24. The circuit of claim 22 wherein:
   said output stage includes means for generating a feedback signal as a function of said converted signal;
   each said transistor of said differential pair in said input stage is coupled to said output stage to receive said feedback signal as its respective input signal such that said apparatus functions as a precision voltage reference generator.

* * * * *